United States Patent
Yumoto et al.

(10) Patent No.: US 7,486,079 B2
(45) Date of Patent: Feb. 3, 2009

(54) AVAILABLE INPUT-OUTPUT POWER ESTIMATING DEVICE FOR SECONDARY BATTERY

(75) Inventors: Daijiro Yumoto, Zama (JP); Hideo Nakamura, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 80 days.

(21) Appl. No.: 11/149,558

(22) Filed: Jun. 10, 2005

(65) Prior Publication Data

US 2005/0275407 A1 Dec. 15, 2005

(30) Foreign Application Priority Data

Jun. 11, 2004 (JP) ............... 2004-173448

(51) Int. Cl.
*G01N 27/416* (2006.01)
(52) U.S. Cl. ............... 324/427; 324/426; 324/430; 324/433; 320/132; 702/63
(58) Field of Classification Search ............... 320/132, 320/161–164; 324/430, 433, 427, 426; 702/63, 702/64, 65, 182, 190
See application file for complete search history.

(56) References Cited

U.S. PATENT DOCUMENTS

| | | | | |
|---|---|---|---|---|
| 5,281,919 A | * | 1/1994 | Palanisamy | 324/427 |
| 5,617,324 A | * | 4/1997 | Arai | 702/63 |
| 5,744,963 A | * | 4/1998 | Arai et al. | 324/427 |
| 6,064,180 A | * | 5/2000 | Sullivan et al. | 320/132 |
| 6,104,167 A | * | 8/2000 | Bertness et al. | 320/132 |
| 6,160,382 A | * | 12/2000 | Yoon et al. | 320/136 |
| 6,417,668 B1 | * | 7/2002 | Howard et al. | 324/426 |
| 6,441,586 B1 | * | 8/2002 | Tate et al. | 320/132 |

(Continued)

FOREIGN PATENT DOCUMENTS

JP 2003-075517 A 3/2003

(Continued)

OTHER PUBLICATIONS

D. Yumoto, et al., "Method of Estimating Internal State Quantity of Battery Using Adaptive Digital Filter Theory," Automobile Technology Association, Academic Lecture Handout, No. 20035031, May 21, 2003, pp. 1-6.

*Primary Examiner*—Akm E Ullah
*Assistant Examiner*—M'Baye Diao
(74) *Attorney, Agent, or Firm*—Foley & Lardner LLP

(57) ABSTRACT

An available input-output power estimating device for a secondary battery includes a parameter estimating section substituting a measured current value I and a measured voltage value V into an adaptive digital filter using an equivalent circuit model of the secondary battery for thereby collectively estimating values of parameters in the equivalent circuit model, an open circuit voltage calculator substituting I, V, and the estimated parameter values into the equivalent circuit model for calculating an open circuit voltage $\hat{V}_0$, an available input power estimating section estimating an available input power $P_{in}$ of the secondary battery using components $(\hat{a}_n, \hat{b}_n)$, associated with a direct term in the equivalent circuit model, in the estimated parameters, the open circuit voltage estimate value $\hat{V}_0$ and an upper limit voltage $V_{max}$ of the terminal voltage, and an available output power estimating section estimating an available output power $P_{out}$ for the secondary battery using $(\hat{a}_n, \hat{b}_n)$, $\hat{V}_0$ and a lower limit voltage $V_{min}$ of the terminal voltage.

5 Claims, 7 Drawing Sheets

U.S. PATENT DOCUMENTS

| | | | |
|---|---|---|---|
| 6,534,954 B1 * | 3/2003 | Plett | 320/132 |
| 6,727,708 B1 * | 4/2004 | Dougherty et al. | 324/427 |
| 6,750,656 B2 * | 6/2004 | Ingesson et al. | 324/427 |
| 6,947,855 B2 * | 9/2005 | Verbrugge et al. | 702/63 |
| 7,154,247 B2 * | 12/2006 | Kikuchi et al. | 320/132 |
| 7,164,256 B2 * | 1/2007 | Mentgen et al. | 320/132 |
| 2003/0076109 A1 * | 4/2003 | Verbrugge et al. | 324/427 |
| 2004/0158418 A1 * | 8/2004 | Kato et al. | 702/63 |
| 2004/0169495 A1 * | 9/2004 | Yumoto et al. | 320/132 |
| 2005/0021254 A1 * | 1/2005 | Merl et al. | 702/65 |

FOREIGN PATENT DOCUMENTS

| | | |
|---|---|---|
| JP | 2003-075518 A | 3/2003 |
| JP | 2003-185719 A | 7/2003 |
| JP | 2003-346914 A | 12/2003 |
| JP | 2003-346915 A | 12/2003 |
| JP | 2004-014231 A | 1/2004 |
| JP | 2004-079472 A | 3/2004 |

* cited by examiner

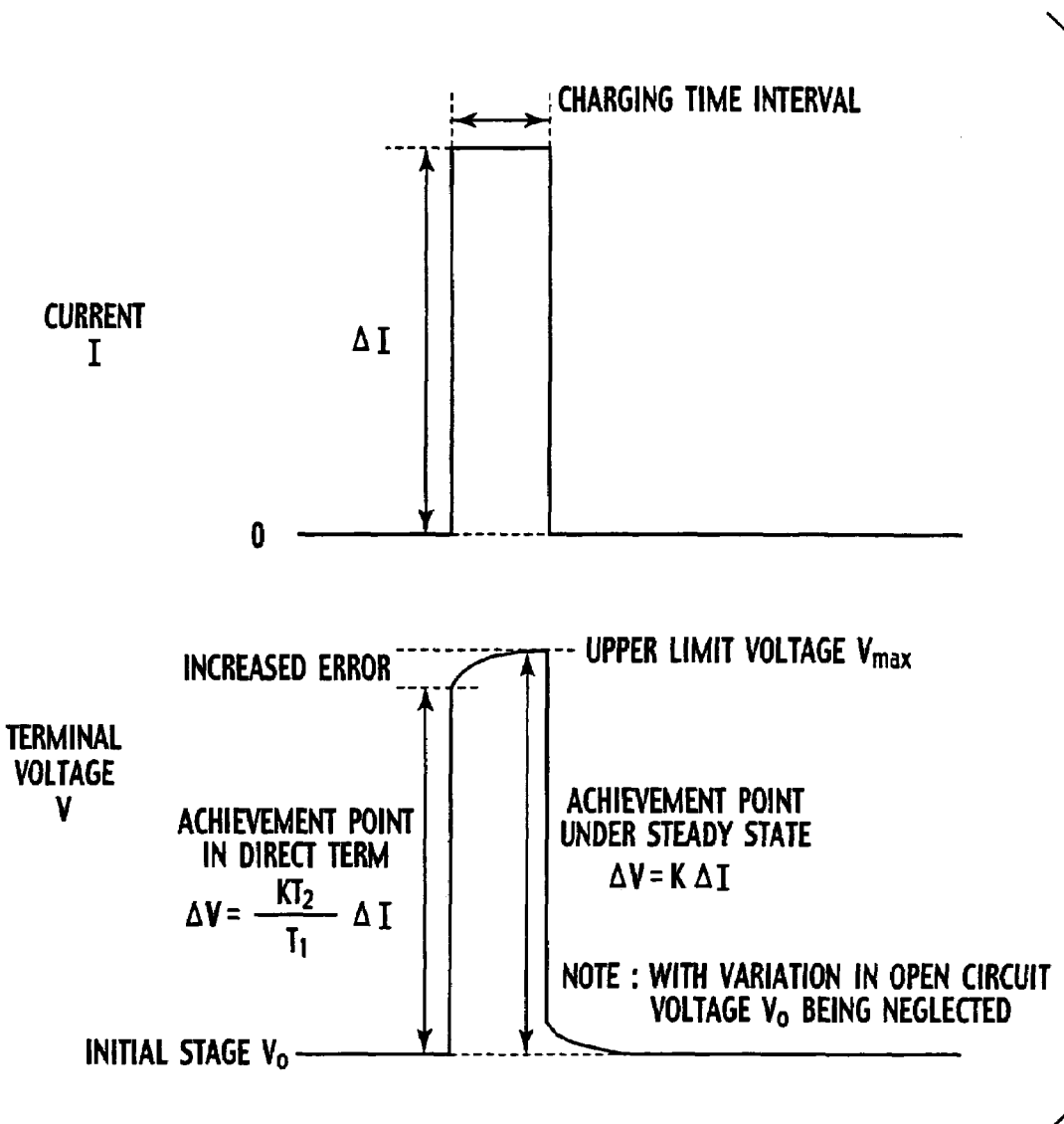

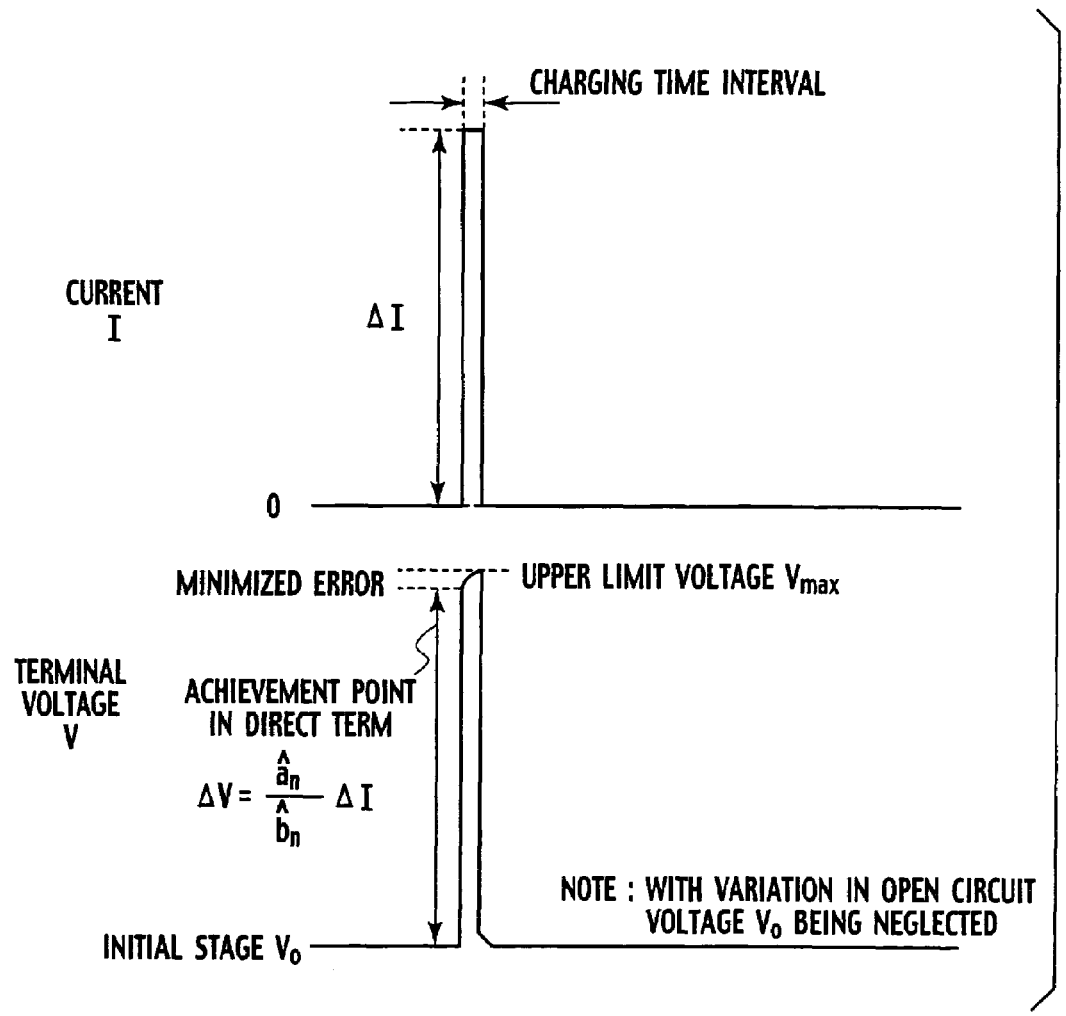

AVAILABLE INPUT-OUTPUT POWER ESTIMATING DEVICE FOR SECONDARY BATTERY

BACKGROUND OF THE INVENTION

The present invention relates to a technology of estimating power available to be inputted to and outputted from a secondary battery.

Such a technology is disclosed in the following literature: Daijiro Yumoto, Hideo Nakamura, Mayumi Hirota, and Norimasa Ochi, "Method of Estimating Internal State Quantity of Battery using Adaptive Digital Filter Theory", Automobile Technology Association Spring-Autumn Academic Lecture Handout No. 20035031, May 21, 2003.

In the literature, measured values of current I and terminal voltage V, both of which are observable, are substituted into an adaptive digital filter using a battery model represented by $$V = \frac{K(T_2 s + 1)}{T_1 s + 1} I + \frac{1}{T_1 s + 1} V_0 \qquad (1)$$

for estimating values of parameters (internal resistance K and open circuit voltage $V_0$). Then, substituting estimated values $\hat{K}$ and $\hat{V}_0$ of the internal resistance K and the open circuit voltage $V_0$, and a lower limit value $V_{min}$ of the terminal voltage V into a steady-state battery model given by $$V = KI + V_0 \qquad (2)$$

allows a value (estimate value) of current $I_{out}$, at which a lower limit voltage value $V_{min}$ is reached, to be calculated by $$\hat{I}_{out} = \frac{V_{min} - \hat{V}_0}{\hat{K}}. \qquad (3)$$

This permits a value of available output power $P_{out}$ to be estimated by $$\hat{P}_{out} = V_{min} |\hat{I}_{out}| = \frac{\hat{V}_0 - V_{min}}{\hat{K}} V_{min}, \qquad (4)$$

using the calculated current value $\hat{I}_{out}$ and the lower limit value $V_{min}$.

Likewise, substituting the estimated values $\hat{K}$, $\hat{V}_0$ of the internal resistance K and the open circuit voltage $V_0$ and an upper limit value $V_{max}$ of the terminal voltage V into Eq. (2) allows a value (estimate value) of current $I_{in}$, at which an upper limit value $V_{max}$ is reached, to be calculated by $$\hat{I}_{in} = \frac{V_{max} - \hat{V}_0}{\hat{K}}. \qquad (5)$$

This permits a value of available input power $P_{in}$ to be estimated by $$\hat{P}_{in} = V_{max} \hat{I}_{in} = \frac{V_{max} - \hat{V}_0}{\hat{K}} V_{max}, \qquad (6)$$

using the calculated current value $\hat{I}_{in}$ and the upper limit voltage value $V_{max}$.

Here, the term "open circuit voltage $V_0$" means a terminal voltage during current shutoff; the term "available input power $P_{in}$" an instantaneous maximum input power in a range wherein a value of the terminal voltage V does not exceed the upper limit voltage value $V_{max}$ that is predetermined for battery protection; and the term "available output power $P_{out}$" an instantaneous maximum output power in a range wherein a value of the terminal voltage V does not exceed the lower limit voltage value $V_{min}$ that is predetermined for battery protection.

In general, since a value of the terminal voltage V of a secondary battery momentarily varies during a transitional period (that is, charging and discharging period) and a period until the terminal voltage V is stabilized after the charging and discharging, mere attempt to measure a value of the terminal voltage V results in an inability of accurately detecting the open circuit voltage $V_0$ as needed.

Also, throughout the following description, a symbol "^" denotes an estimate value.

SUMMARY OF THE INVENTION

As will be understood from the fact that the steady-state battery model (2) is used to obtain the available input power $P_{in}$, the above-described technology is based on the assumption that a charging period is sufficiently long such that a value of the terminal voltage V reaches at the upper limit voltage value $V_{max}$ under the steady state. In other words, this means that the charging period is longer than a time constant $T_1$ in the equation (7) described below, for example, approximately 2 or 3 seconds.

However, since only a direct term $$\left( \frac{KT_2}{T_1} I \right)$$

in Eq. (7) affects a value of the terminal voltage V in the leading edge thereof, it does not reach at the upper limit voltage value $V_{max}$ (with a reason described below) in cases where the charging period is short like that of pulsed charging. Then, since an estimate value $\hat{K}$ of internal resistance K contains a large error, an estimate value $\hat{P}_{in}$ of the obtained available input power $P_{in}$ inevitably contains an error, too. A similar issue arises in an estimate value $\hat{P}_{out}$ of the available output power $P_{out}$.

The present invention has been completed with the above view in mind and has an object to provide an available input-output power estimating device for a secondary battery wherein an error of an estimate value is minimized even when charging and discharging are executed for a short time.

To achieve the above object, the present invention provides an available input-output power estimating device for a secondary battery, comprising: a current detector detecting a value I of a current of the secondary battery; a voltage detector detecting a value V of a terminal voltage of the secondary battery; a parameter estimating section substituting the measured current value I and voltage value V into an adaptive digital filter using a battery model represented by an equation (a) for thereby collectively estimating a value of a parameter vector, as a parameter vector estimate value, in the equation (a); an open circuit voltage calculator substituting the measured current value I, the voltage value V, and the parameter estimate value into the equation (a) for thereby calculating a value $\hat{V}_0$ of an open circuit voltage; an available input power estimating section substituting a set of components $(\hat{a}_n, \hat{b}_n)$ in the parameter vector estimate value, which is associated with a direct term in the equation (a); the open circuit voltage estimate value $\hat{V}_0$, and an upper limit voltage $V_{max}$, which is predetermined, of the terminal voltage into an equation (b) for thereby estimating an available input power $P_{in}$ of the secondary battery; and an available output power estimating section substituting the set of components $(\hat{a}_n, \hat{b}_n)$ in the parameter vector estimate value, which is associated with the direct term in the equation (a), the open circuit voltage estimate value $\hat{V}_0$, and a lower limit voltage $V_{min}$, which is predetermined, of the terminal voltage V into an equation (c) for thereby estimating an available output power $P_{out}$ of the secondary battery, wherein the equations (a), (b) and (c) are described, respectively, as $$V = \frac{B(s)}{A(s)}I + \frac{1}{C(s)}V_0, \tag{a}$$

$$P_{in} = \frac{V_{max} - \hat{V}_0}{\hat{b}_n}\hat{a}_n V_{max}, \text{ and} \tag{b}$$

$$P_{out} = \frac{\hat{V}_0 - V_{min}}{\hat{b}_n}\hat{a}_n V_{min} \tag{c}$$

where A(s), B(s), and C(s) represent polynomials of a Laplace operator s, respectively, as follows:

$$A(s) = \sum_{k=0}^{n} a_k s^k, B(s) = \sum_{k=0}^{n} b_k s^k, \text{ and } C(s) = \sum_{k=0}^{n} c_k s^k \tag{d}$$

where the first order coefficients $a_1$, $b_1$, and $c_1$ of the polynomials take non-zero values, respectively.

Also, the present invention provides an estimating method of an available input-output power for a secondary battery, comprising: measuring a value I of a current of the secondary battery; measuring a value V of a terminal voltage of the secondary battery; substituting the measured current value I and the measured voltage value V into an adaptive digital filter using a battery model represented by an equation (a) for thereby collectively estimating a value of a parameter vector, as a parameter vector estimate value, in the equation (a); substituting the measured current value I, the measured voltage value V, and the parameter estimate value into the equation (a) for thereby calculating a value $\hat{V}_0$, as an open circuit voltage estimate value, of an open circuit voltage; substituting a set of components $(\hat{a}_n, \hat{b}_n)$, which is associated with a direct term in the equation (a), of the parameter vector estimate value, the open circuit voltage estimate value $\hat{V}_0$, and an upper limit voltage $V_{max}$, which is predetermined, of the terminal voltage V into an equation (b) for thereby estimating an available input power $P_{in}$ of the secondary battery; and substituting the one set of components $(\hat{a}_n, \hat{b}_n)$, which is associated with the direct term in the equation (a), of the parameter vector estimate value, the open circuit voltage estimate value $\hat{V}_0$, and a lower limit voltage $V_{min}$, which is predetermined, of the terminal voltage V into an equation (c) for thereby estimating an available output power $P_{out}$ of the secondary battery; wherein the equations (a), (b), and (c) are described, respectively, as $$V = \frac{B(s)}{A(s)}I + \frac{1}{C(s)}V_0, \tag{a}$$

$$P_{in} = \frac{V_{max} - \hat{V}_0}{\hat{b}_n}\hat{a}_n V_{max}, \text{ and} \tag{b}$$

$$P_{out} = \frac{\hat{V}_0 - V_{min}}{\hat{b}_n}\hat{a}_n V_{min} \tag{c}$$

where A(s), B(s), and C(s) represent polynomials of a Laplace operator s, respectively, as follows:

$$A(s) = \sum_{k=0}^{n} a_k s^k, B(s) = \sum_{k=0}^{n} b_k s^k, \text{ and } C(s) = \sum_{k=0}^{n} c_k s^k \tag{d}$$

where the first order coefficients $a_1$, $b_1$, and $c_1$ of the polynomials take non-zero values, respectively.

BRIEF DESCRIPTION OF THE DRAWINGS

FIG. 7 is a view for illustrating an estimate value of available input power in the related art.

FIG. 8 is a view for illustrating an estimate value of available input power in the present invention.

DETAILED DESCRIPTION OF THE PREFERRED EMBODIMENTS

Figure 1:
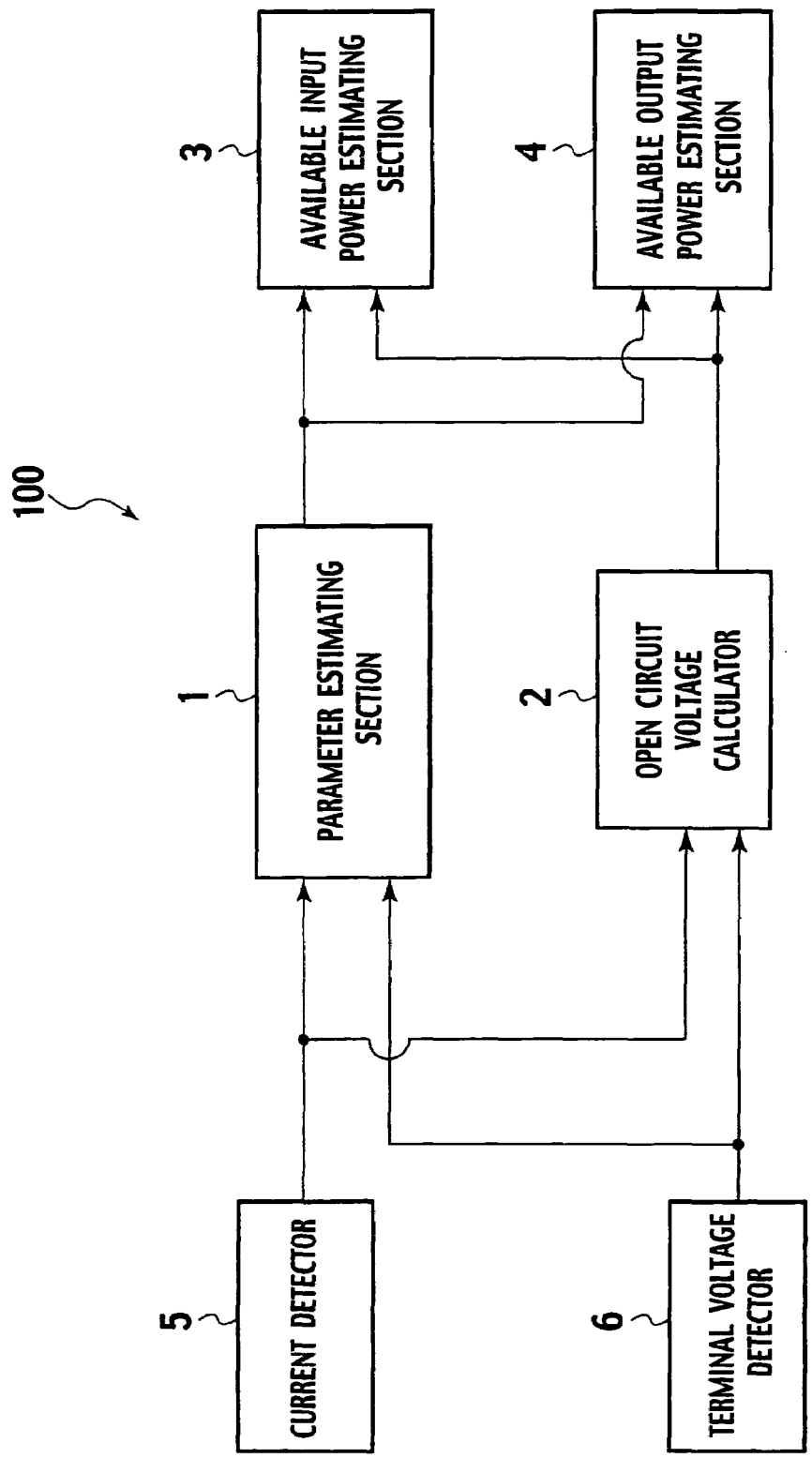
FIG. 1 is a functional block diagram of an available input-output power estimating device according to the present invention.

FIG. 1 is a functional block diagram of an available input-output power estimating device according to the present invention.

The available input-output power estimating device 100 is comprised of a current detector 5 that detects a value of current I charged to and discharged from a secondary battery (which may be merely a battery), a terminal voltage detector 6 that detects a value of a terminal voltage V of the secondary voltage, a parameter estimating section 1 that collectively estimates a value (which will be described later in detail) of a parameter vector $\vec{\theta}$ in a battery model, with an open circuit voltage $V_0$ defined as an offset term, using the current value detected by the current detector 5 and the terminal voltage value detected by the terminal voltage detector 6, an open circuit voltage calculator 2 that calculates a value of the open circuit voltage $V_0$ based on the current value and the terminal voltage value, detected in the manner mentioned above, and the parameter vector value estimated in the manner described above, an available input power estimating section 3 that estimates a value $P_{in}$ of an available input-output power of the secondary battery based on the parameter vector value, estimated in the manner described above, and the open circuit voltage calculated in the manner mentioned above, and an available output power estimating section 4 that estimates a value $P_{out}$ of available input-output power of the secondary battery based on the parameter vector value estimated in the manner described above.

Figure 2:
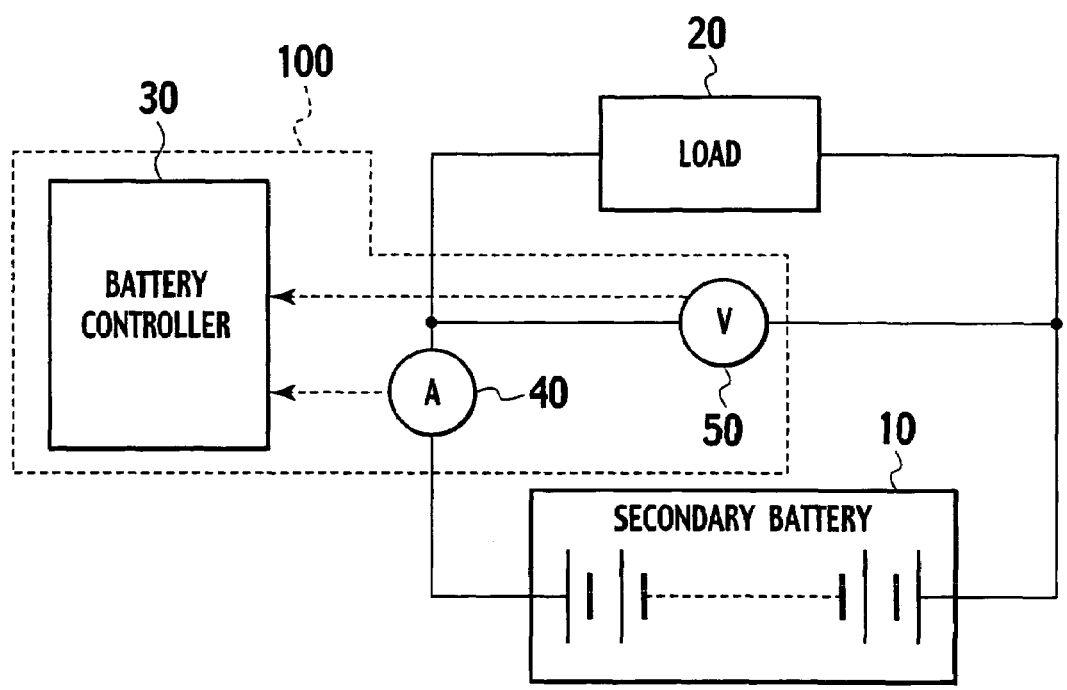
FIG. 2 is a block diagram showing a concrete structure of the available input-output power estimating device shown in FIG. 1.

FIG. 2 is a block diagram showing a concrete structure of the available input-output power estimating device 100 shown in FIG. 1. Here, an exemplary structure is shown wherein the available input-output power estimating device 100 is applied to a system wherein a load 20, such as a motor, is driven with the secondary battery 10 and the secondary battery 10 is charged with regenerative power of the motor.

The available input-output power estimating device 100 includes a battery controller (electronic control unit) 30, an ammeter 40 that detects the current I charged to and discharged from the secondary battery 10, and a voltmeter 50 that detects the terminal voltage V of the secondary battery 10.

The battery controller 30 is structured of a microcomputer, composed of a CPU for calculating programs, a ROM storing the programs and a RAM that stores calculation results, and electronic circuitries, to which the ammeter 40, the voltmeter 50 and a temperature gauge (not shown), which detects temperatures of the battery, are connected.

The battery controller 30 corresponds to the parameter estimating section 1, the open circuit voltage calculator 2, the available input power estimating section 3 and the available output power estimating section 4, which are shown in FIG. 1; the ammeter 40 corresponds to the current detector 5; and the voltmeter 5 corresponds to the terminal voltage detector 6.

Next, an essence of the present invention is described with a view to providing the ease of understanding the present specification.

In the present invention, a higher order model is assumed to be an equivalent circuit model of a secondary battery (hereinafter referred to as a battery model) that is described as $$V = \frac{B(s)}{A(s)} I + \frac{1}{C(s)} V_0 \quad (7)$$

where A(s), B(s) and C(s) represent polynomials of a Laplace operator (or Laplace variable) s given as $$A(s) = \sum_{k=0}^{n} a_k s^k, \ B(s) = \sum_{k=0}^{n} b_k s^k, \text{ and } C(s) = \sum_{k=0}^{n} c_k s^k \quad (8)$$

where first order coefficients $a_1, b_1, C_n$ of the respective polynomials take non-zero values, respectively.

Substituting measured values of the current I and the terminal voltage V into an adaptive digital filter using the battery model (7) allows the calculation of estimate values $(\hat{a}_n, \hat{b}_n)$ of parameters $(a_n, b_n)$ (that is, coefficients of the maximum order of polynomials A(s), B(s) of Eq. (8)), associated with the direct term in Eq. 7. Thus, substituting the estimate values $(\hat{a}_n, \hat{b}_n)$ of the parameters $(a_n, b_n)$ and the measured value of the terminal voltage V into Eq. (7) allows the calculation of an estimate value $\hat{V}_0$ of the open circuit voltage $V_0$. Using the estimate values $(\hat{a}_n, \hat{b}_n)$ of the parameters, the estimate value $\hat{V}_0$ of the open circuit voltage $V_0$ and an upper limit voltage value $V_{max}$ allows available input power $P_{in}$ of the secondary battery to be estimated by $$P_{in} = \frac{V_{max} - \hat{V}_0}{\hat{b}_n} \hat{a}_n V_{max}. \quad (9)$$

At the same time, using the estimate values $(\hat{a}_n, \hat{b}_n)$ of the parameters, the estimate value $\hat{V}_0$ of the open circuit voltage $V_0$, and a lower limit voltage value $V_{min}$ allows available output power $\hat{P}_{out}$ of the secondary battery to be estimated by $$P_{out} = \frac{\hat{V}_0 - V_{min}}{\hat{b}_n} \hat{a}_n V_{min}. \quad (10)$$

Hereinafter, the present invention is described in detail using concrete embodiments.

First Embodiment

Figure 3:
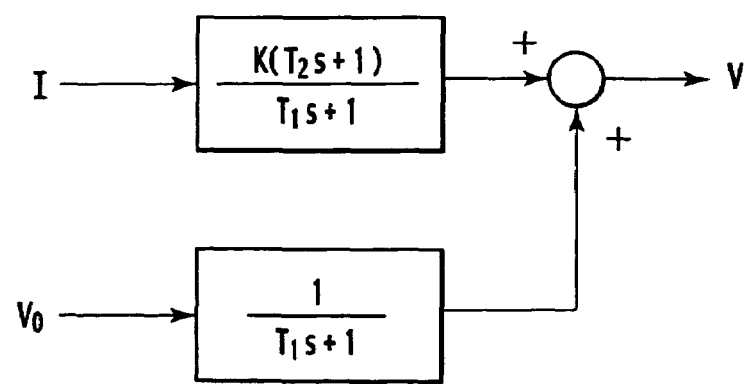
FIG. 3 is a view showing an equivalent circuit model of a secondary battery of a first embodiment according to the present invention.

FIG. 3 is a view showing a battery model of a secondary battery of a first embodiment.

Although this battery model is a reduction (primary) model without particular separation in positive and negative electrodes, this battery model is sufficient to illustrate charging and discharging characteristics of an actual secondary battery. In this figure, I represents current [A] (with a positive value representing a charging period while a negative value represents a discharging period); V a terminal voltage [V]; $V_0$ an open circuit voltage [V] (also called an electromotive force or an open circuit voltage); K internal resistance; $T_1$ and $T_2$ time constants; and s a Laplace operator (or Laplace variable).

This battery model is represented by $$V = \frac{K(T_2 s + 1)}{T_1 s + 1} I + \frac{1}{T_1 s + 1} V_0. \quad (11)$$

Since Eq. (11) is a special case of Eq. (7) where both the denominators A(s) and C(s) of the first and second terms on the right side in Eq. (7) take $A(s)=C(s)=T_1 s+1$, Eq. (11) well describes a battery such as a lithium battery in which an open circuit voltage converges at a relatively high speed.

First, a derivation process of an adaptive digital filter using the battery model (11) is described below.

Since it is considered that the open circuit voltage $V_0$ is equivalent to a value that the current I multiplied by variable efficiency h is integrated from an initial state, then the open circuit voltage $V_0$ can be described as $$V_0 = \frac{h}{s} I. \quad (12)$$

Then, substituting Eq. (12) into Eq. (11) gives $$V = \frac{K(T_2 s + 1)}{T_1 s + 1} I + \frac{1}{T_1 s + 1} \frac{h}{s} I \quad (13)$$
$$= \frac{K T_2 s^2 + K s + h}{T_1 s^2 + s} I.$$

Next, multiplying both sides of Eq. (13) by a lowpass filter (or band pass filter) operator $G_{lp}(s)$ gives $$G_{lp}(s)(T_1 s^2 + s) V = G_{lp}(s)(K T_2 s^2 + K s + h) I. \quad (14)$$

Also, the current I and the terminal voltage V multiplied by the lowpass filter operator $G_{lp}(s)$ are defined as $$V_3 = s^2 G_{lp}(s) V, \ V_2 = s G_{lp}(s) V, \ V_1 = G_{lp}(s) V,$$
$$I_3 = s^2 G_{lp}(s) I, \ I_2 = s G_{lp}(s) I, \ I_1 = G_{lp}(s) I. \quad (15)$$

Here, the lowpass filter operator $G_{lp}(s)$ is given as $$G_{lp} = \frac{1}{(ps+1)^3} \quad (16)$$

wherein p represents a response time constant determining a response characteristic of the lowpass filter operator $G_{lp}(s)$.

Substituting Eqs. (15) and (16) into Eq. (14) gives $$T_1 V_3 + V_2 = K T_2 I_3 + K I_2 + h I_1 \quad (17)$$

Eq. (17) can be further rewritten in a vector representation as $$V_2 = -T_1 V_3 + K T_2 I_3 + K I_2 + h I_1 = (V_3 \ I_3 \ I_2 \ I_1) \cdot \begin{pmatrix} -T_1 \\ K T_2 \\ K \\ h \end{pmatrix}. \quad (18)$$

Since Eq. (18) is represented with an inner product between a known vector having components $V_3, I_3, I_2, I_1$ as observable quantities, and an unknown vector having components $T_1, T_2, K, h$ as parameters, Eq. (18) can be reduced to a standard form of a general adaptive digital filter given as $$y = \vec{\omega}^T \cdot \vec{\theta} \quad (19)$$

where $$y \equiv V_2, \vec{\omega}^T \equiv (V_3, I_3, I_2, I_1), \vec{\theta}^T \equiv (-T_1, K T_2, K, h) \quad (20)$$

Accordingly, using the current I and the terminal voltage V filtered by the adaptive digital filter enables a value of a parameter vector $\vec{\theta}$ to be estimated.

Here it should be noted that the above derivation process of the adaptive digital filter using the battery model (11) is established for the more general first order battery model described as $$V = \frac{K(T_2 s + 1)}{T_1 s + 1} I + \frac{1}{T_3 s + 1} V_0. \quad (11\text{-}a)$$

where $T_3$ is a time constant different from the time constant $T_1$ in general. In other words, an adaptive digital filter using the battery model (11-a) is reduced to the standard form (19), too.

In the presently filed embodiment, in order to estimate the parameter vector $\vec{\theta}$, the both-limits trace gain method is used instead of the least square method because the least square method has a disadvantage such that once a value of the parameter vector $\vec{\theta}$ is converged to a local minimum value, subsequent variation in parameters make it difficult to converge a true minimum value of the parameter vector $\vec{\theta}$. An algorithm of the both-limits trace gain method is described as follows:

$$\vec{\theta}(k) = \vec{\theta}(k-1) - \gamma(k) P(k-1) \vec{\omega}(k) \cdot [\vec{\omega}^T(k) \cdot \vec{\theta}(k-1) - y(k)], \quad (21)$$

$$\gamma(k) = \frac{\lambda_3}{1 + \lambda_3 \vec{\omega}^T(k) \cdot P(k-1) \vec{\omega}(k)},$$

$$P(k) = \frac{1}{\lambda_1(k)} \left\{ \begin{array}{c} P(k-1) - \\ \frac{\lambda_3 P(k-1) \vec{\omega}(k) \cdot \vec{\omega}^T(k) P(k-1)}{1 + \lambda_3 \vec{\omega}^T(k) \cdot P(k-1) \vec{\omega}(k)} \end{array} \right\}$$

$$= \frac{P'(k)}{\lambda_1(k)},$$

$$\lambda_1(k) = \begin{cases} \frac{tr\{P'(k)\}}{\gamma_U} & \text{for } \lambda_1 \leq \frac{tr\{P'(k)\}}{\gamma_U} \\ \lambda_1 & \text{for } \frac{tr\{P'(k)\}}{\gamma_U} \leq \lambda_1 \leq \frac{tr\{P'(k)\}}{\gamma_L} \\ \frac{tr\{P'(k)\}}{\gamma_L} & \text{for } \frac{tr\{P'(k)\}}{\gamma_L} \leq \lambda_1 \end{cases}$$

where variable k represents a parameter of an iteration; and $\vec{\theta}(k)$ a value of a parameter vector $\vec{\theta}$ at a k-th time's iteration with an initial value $\vec{\theta}(0)$ being set to a sufficiently less value to be non-zero. Also, it is assumed that $\lambda_1, \lambda_3, \gamma_U, \gamma_L$ represent initial values and further $\lambda_1, \lambda_3$ satisfy the conditions $0 < \lambda_1 < 1$, $0 < \lambda_3 < \infty$, respectively. Furthermore, P(k) is a matrix with an initial value P(0) set to a sufficiently large value. The symbol tr{P'(k)} represents a trace of the matrix P'(k).

Figure 5:
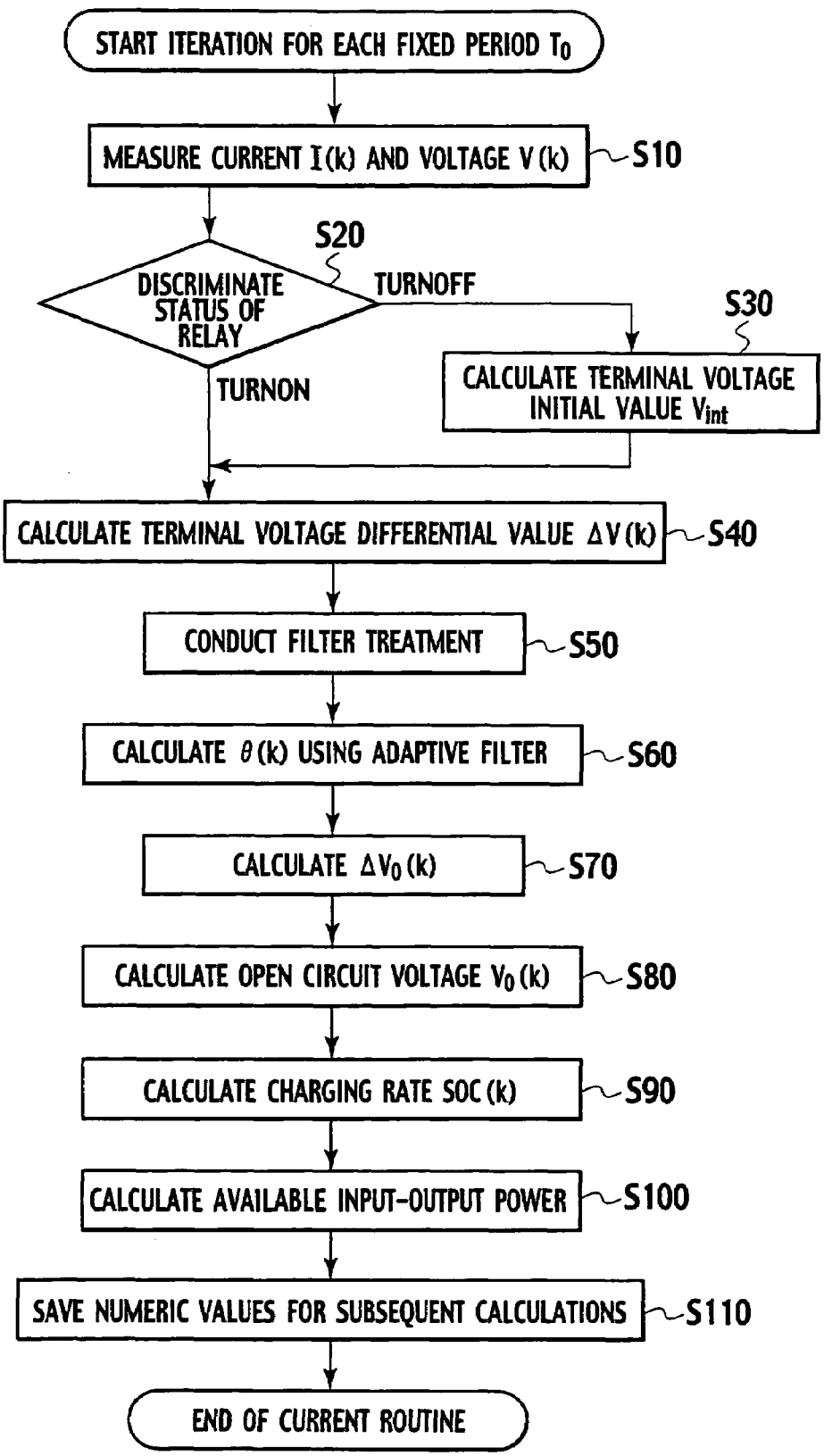
FIG. 5 is a flowchart of operation procedures to be executed by a battery controller 30.

Now, description is made of operation procedures to be executed by the battery controller 30 using a flowchart of FIG. 5. In FIG. 5, the iteration is implemented for each fixed period $T_0$. Hereinafter, description is made of an operation process in the k-th time's iteration.

In step S10, the operation is executed to measure a value I(k) of current I and a value V(k) of a terminal voltage V.

In step S20, the operation is executed to discriminate whether a shutoff relay of the secondary battery is turned on or turned off. The battery controller 30 also executes control of the shutoff relay of the secondary battery and the operation goes to step S30 when the shutoff relay is turned off (with current I=0). When the relay is turned on, the operation goes to step S40.

In step S30, a value V(k) of the terminal voltage V is stored as a terminal voltage initial value $V_{int}$.

In step S40, a differential value $\Delta V(k)$ of the terminal voltage V is calculated by $$\Delta V(k) = V(k) - V_{int} \quad (22)$$

This calculation is conducted for avoiding divergence in a value of a parameter vector $\vec{\theta}$ during a start in estimating calculation because an initial value $\vec{\theta}(0)$ is set to a sufficiently less value to be non-zero. During shutoff of the relay, since exactly I(k)=0 and ΔV(k)=0, the initial value $\vec{\theta}(0)$ of the parameter vector $\vec{\theta}$ remains the initial state.

In step S50, by using Eqs. (15) and (16), a value I(k) of current I and a differential value ΔV(k) of the terminal voltage V are filtered with a lowpass filter operator $G_{lp}(s)$, thereby calculating values $I_1(k)\sim I_3(k)$ and $V_1(k)\sim V_3(k)$ of $I_1\sim I_3$ and $V_1\sim V_3$.

In this case, in order to increase an estimating accuracy of the algorithm in Eq. (21) (that is, for the purpose of minimizing noise), a time constant p of the lowpass filter operator $G_{lp}(s)$ is set to have a value by which a response of a lowpass filter operator $G_{lp}(s)$ is delayed. However, this time constant p is set to provide a faster response than that of the secondary battery.

In step S60, substituting the values $I_1(k)\sim I_3(k)$ and $V_1(k)\sim V_3(k)$ into Eq. (21) allows the calculation of a value $\vec{\theta}(k)$ of the parameter vector $\vec{\theta}$.

In step S70, components $T_1(k)$, $K(k)T_2(k)$, $K(k)$ of the parameter vector $\vec{\theta}(k)$ calculated in step S60 and the values $I_1(k)\sim I_3(k)$ and $V_1(k)\sim V_3(k)$ calculated in step S50 are substituted into $$\Delta V_0(k) = G_{lp}(s) \cdot V_0(k) \quad (23)$$
$$= G_{lp}(s) \cdot \{(T_1(k)s+1)V(k) - K(k)(T_2(k)s+1)I(k)\}$$
$$= V_1(k) + T_1(k)V_2(k) - K(k)T_2(k)I_2(k) - K(k)I_1(k).$$

Here, Eq. (23) is derived by multiplying both sides of an equation given as $$V_0(k)=(T_1(k)s+1)V(k)-K(k)(T_2(k)s+1)I(k), \quad (24)$$

that is the modified Eq. (11), by the lowpass filter operator $G_{lp}(S)$. Since the open circuit voltage $V_0$ slowly varies, $\Delta V_0(k)(=G_{lp}(s)\cdot V_0(k))$ represented by Eq. (23) can be used as a substitute for the value $V_0(k)$ of the open circuit voltage $V_0$.

In step S80, by adding the initial value (that is, the initial value $V_{int}$ of the terminal voltage V(k)) of the open circuit voltage $V_0$ to the differential value ΔV(k) of the terminal voltage V calculated in step S70, a value $V_0(k)$ of the open circuit voltage $V_0$ can be calculated as $$V_0(k)=\Delta V_0(k)+V_{int}. \quad (25)$$

Figure 4:
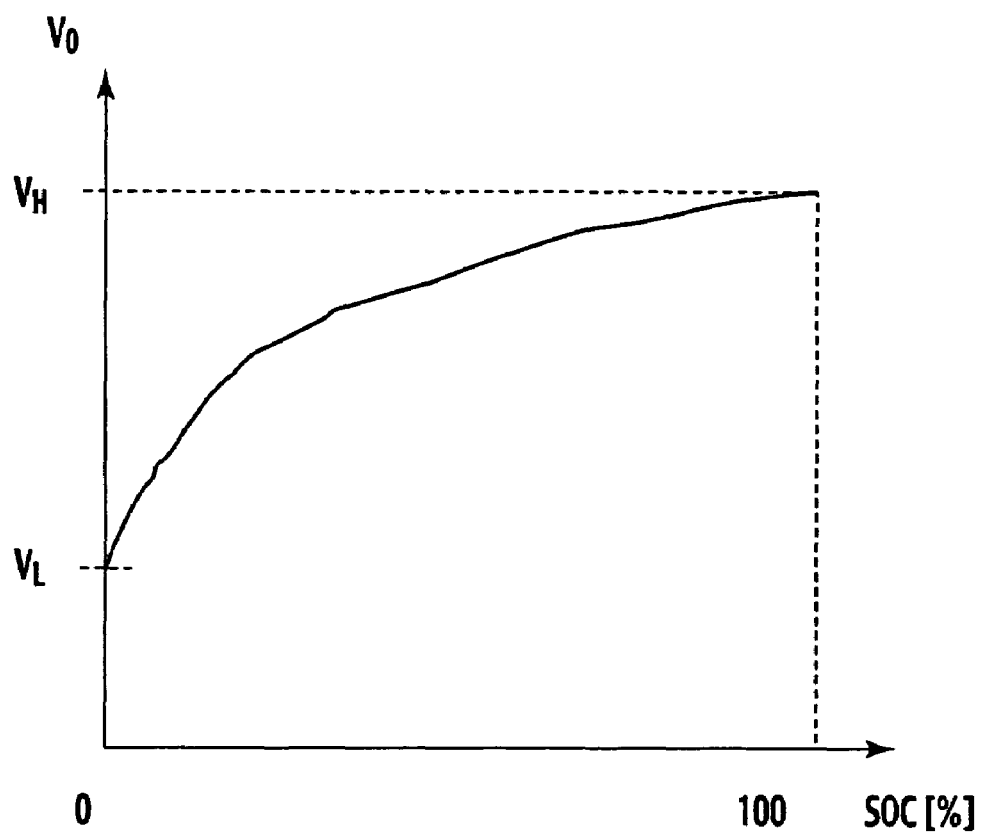
FIG. 4 is a view showing a correlation map between an open circuit voltage and a charging rate.

In step 90, a charging ratio SOC(k) is calculated based on the $V_0(k)$ of the open circuit voltage $V_0$ calculated in step S80, by using a correlation map between the open circuit voltage $V_0$ and the charging ratio shown in FIG. 4. Here, in FIG. 4, $V_L$ and $V_H$ represent open circuit voltage values corresponding to SOC=0% and SOC=100%, respectively.

In step S100, values of allowable input and output powers $P_{in}$ and $P_{out}$ are calculated. For that purpose, there is a need to focus on the direct term in Eq. (11) because an instantaneous current value for a value of the terminal voltage V reaching at an upper voltage value $V_{max}$ and a lower voltage value $V_{min}$. Therefore, the direct term is described below. Also, the upper voltage value $V_{max}$ and the lower voltage value $V_{min}$ represent predetermined upper and lower limits by which the secondary battery is protected and take fixed values, respectively.

First, Eq. (11-a), representing a general first battery model, is modified as follows:

$$V = \frac{K(T_2s+1)}{T_1s+1}I + \frac{1}{T_3s+1}V_0 \quad (26)$$
$$= \left\{\frac{KT_2}{T_1} + \frac{K\left(1-\frac{T_2}{T_1}\right)}{T_1s+1}\right\}I + \frac{1}{T_3s+1}V_0$$
$$= \frac{KT_2}{T_1}I + \left\{\frac{K\left(1-\frac{T_2}{T_1}\right)}{T_1s+1}I + \frac{1}{T_3s+1}V_0\right\}$$

where a first term on a right side is called a direct term. Here it should be noted that this direct term necessary to calculate available input-output powers $P_{in}$ and $P_{out}$ is not affected by the time constant $T_3$. In Eq. (26), a voltage variation ΔV only for the direct term in terms of a current variation ΔI is given as $$\Delta V = \frac{KT_2}{T_1}\Delta I. \quad (27)$$

Figure 6:
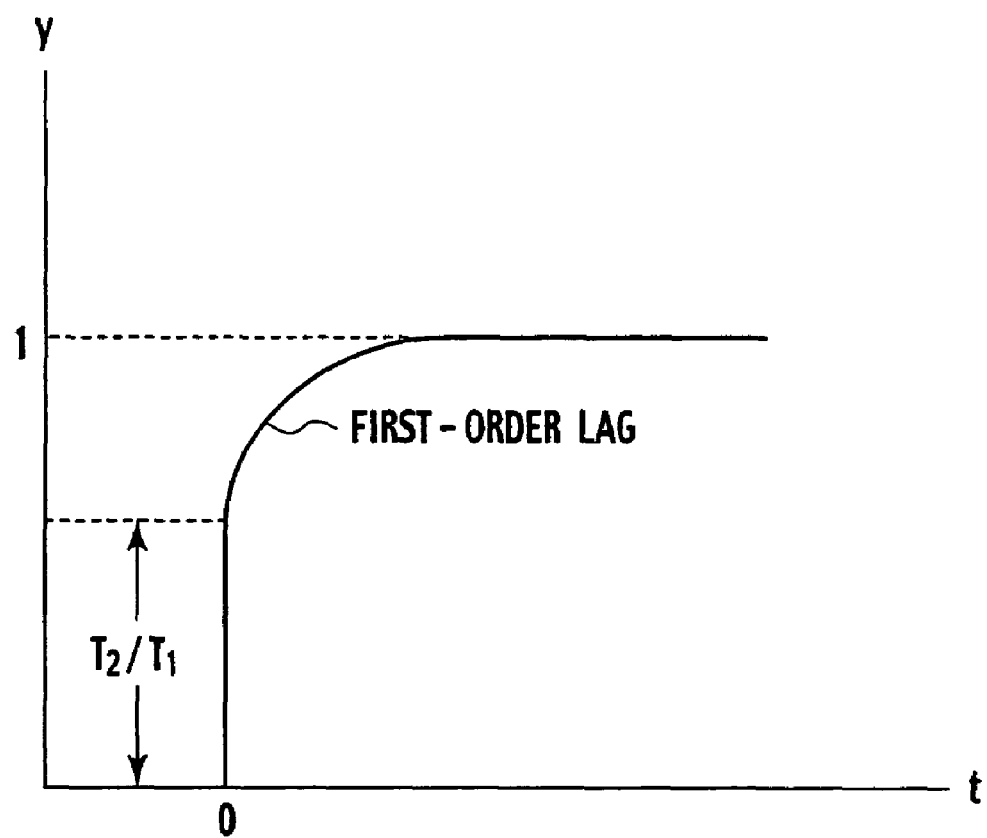
FIG. 6 is a view for illustrating a direct term.

FIG. 6 is a view for illustrating the direct term from another angle and shows a step response function in a real space corresponding to $$y = \frac{T_2s+1}{T_1s+1} \quad (28)$$

in Eq. (26), where $T_1>T_2$. The step response function sharply rises to a value $$\frac{T_2}{T_1}$$

at time 0 and, thereafter, takes a waveform with a first-order lag. The direct term corresponds to the value $$\frac{T_2}{T_1}$$

during the rising period. In the presently filed embodiment, since the value $$\frac{T_2}{T_1}$$

is multiplied by an internal resistance K, the direct term has a coefficient $$\frac{KT_2}{T_1}.$$

However, in the present invention, an estimate value of the parameter corresponding to this coefficient is generally represented as $(\hat{a}_n, \hat{b}_n)$.

In step S100, first, a difference between the upper limit voltage value $V_{max}$ and the value $V_0(k)$ of the open circuit voltage $V_0$ calculated in step S80 (in Eq. (25)) is calculated as $$\Delta V(k) = V_{max} - V_0(k). \tag{29}$$

Next, substituting components $K(k)T_2(k)$, $T_1(k)$ $\Delta V(k)$ of the value $\vec{\theta}(k)$ of the parameter vector $\vec{\theta}$ into Eq. (27) allows a current value $\Delta I$ to be calculated as $$\Delta I(k) = \frac{(V_{max} - V_0(k))T_1(k)}{K(k)T_2(k)}. \tag{30}$$

Using the current variation $\Delta I(k)$ calculated in such a way allows the allowable input power $P_{in}(k)$ in the k-th time's iteration to be calculated as $$P_{in}(k) = V_{max}\Delta I(k) \tag{31}$$
$$= \frac{(V_{max} - V_0(k))T_1(k)}{K(k)T_2(k)} V_{max}.$$

A value $P_{out}(k)$ of the available output power $P_{out}$ in the k-th time's iteration can be similarly derived by calculating a difference between the lower limit voltage value $V_{min}$ and the value $V_0(k)$ (in Eq. (25)) of the open circuit voltage $V_0$ calculated in step S80 as follows:

$$\Delta V(k) = V_0(k) - V_{min}. \tag{32}$$

Then, substituting components $K(k)T_2(k)$ and $T_1(k)$ of the value $\vec{\theta}(k)$ of the parameter vector $\vec{\theta}$ into Eq. (27) allows a current value $\Delta I$ to be calculated as $$\Delta I(k) = \frac{(V_0(k) - V_{min})T_1(k)}{K(k)T_2(k)}. \tag{33}$$

Using the current variation $\Delta I(k)$ calculated in such a way allows the allowable output power $P_{out}(k)$ in the k-th time's iteration to be calculated as $$P_{out}(k) = V_{min}\Delta I(k) \tag{34}$$
$$= \frac{(V_0(k) - V_{min})T_1(k)}{K(k)T_2(k)} V_{min}.$$

In step S110, values needed for subsequent iterations in the values calculated in such a way are stored and the calculation is terminated.

By repeatedly executing the iteration processes in the algorithm (21) of the both-limits trace gain method in such a manner, the estimate value $\hat{P}_{in}$ of the available input power $P_{in}(k)$ and the estimate value $\hat{P}_{out}$ of the available output power $P_{out}$ can be finally obtained as $$\hat{P}_{in} = V_{max}\Delta\hat{I} \tag{35}$$
$$= \frac{(V_{max} - \hat{V}_0)\hat{T}_1}{\hat{K}\hat{T}_2} V_{max}$$

$$= \frac{\hat{T}_1}{\hat{T}_2}\left\{\frac{(V_{max} - \hat{V}_0)}{\hat{K}} V_{max}\right\},$$

$$\hat{P}_{out} = V_{min}\Delta\hat{I} \tag{36}$$
$$= \frac{(\hat{V}_0 - V_{min})\hat{T}_1}{\hat{K}\hat{T}_2} V_{min}$$
$$= \frac{\hat{T}_1}{\hat{T}_2}\left\{\frac{(\hat{V}_0 - V_{min})}{\hat{K}} V_{min}\right\}.$$

Applying the method described above to the general battery model (7) provides results as represented by Eq. (9) and Eq. (10).

Lastly, a difference between the related art and the present invention is described below.

FIG. 7 is a view for illustrating the estimate value of the available input power in the related art described above, and FIG. 8 is a view for illustrating the estimate value of the available input power in the first embodiment according to the present invention.

As shown in FIG. 7, in the related art, a current variation $\Delta I$ was calculated by using the steady-state battery module (2). That is, it was assumed that, in the related art, a charging time interval was sufficiently long such that a value of the terminal voltage V reaches at the upper limit voltage value $V_{max}$ under the steady state. Accordingly, since the variation value in the leading edge of the terminal voltage V is affected by only the direct term in cases where the charging time interval is short like that of the pulsed charging, the voltage variation $\Delta V$ is described as Eq. (27). Accordingly, since the value of the terminal voltage V does not reach at the voltage value of $\Delta V = K\Delta I$ (that is, the upper limit voltage value $V_{max}$) under the steady state, large error is observed in the estimate value $\hat{P}_{in}$ of the allowable input power $P_{in}$. This similarly applies to the estimate value $\hat{P}_{out}$ of the available output power $P_{out}$ under a situation where rapid discharging takes place.

On the contrary, in the presently filed embodiment, since the current variation $\Delta I$ is calculated from Eq. (30) based on the direct term, as shown in FIG. 8, the voltage variation $\Delta V$ in the leading edge of the terminal voltage V is given as $$\Delta V = \frac{\hat{K}\hat{T}_2}{\hat{T}_1}\Delta I. \tag{37}$$

More generally, in the battery model (7) of the secondary battery, the voltage variation $\Delta V$ of the terminal voltage V is given as $$\Delta V = \frac{\hat{a}_n}{\hat{b}_n}\Delta I. \tag{38}$$

From this, it is easily understood that, in the present invention, the voltage variation $\Delta V$ in the leading edge of the terminal voltage V reaches at a value fairly close to the voltage value of $\Delta V = K\Delta I$ (that is, the upper limit voltage value $V_{max}$) under the steady state.

Accordingly, in the present invention, even in cases where the charging time interval is short like that of the pulsed charging, only the voltage variation ΔV (direct term) in the leading edge of the terminal voltage V is able to nearly reach the upper limit voltage value $V_{max}$.

As a result, an error of the estimate value $\hat{P}_{in}$ of the allowable input power $P_{in}$ is reduced. A similar effect results in the estimate value $\hat{P}_{out}$ of the available output power $P_{out}$ under the situation where rapid discharging takes place.

Second Embodiment

A second embodiment is configured such that the lowpass filter treatment is executed on the components $K(k)T_2(k)$, $T_1(k)$ of the value $\vec{\theta}(k)$ of the parameter vector $\vec{\theta}$ (or components ($\hat{a}_n, \hat{b}_n$) in the battery model shown in FIG. 7), which are associated with the direct term, obtained in the first embodiment.

The second embodiment differs from the first embodiment in respect of step S100 in the flowchart of operations in the first embodiment shown in FIG. 5 and is similar thereto in other respect. Therefore, description of the other respect is herein omitted.

Since the components $K(k)T_2(k)$ and $T_1(k)$ of the value $\vec{\theta}(k)$ of the parameter vector $\hat{\theta}$ are easily affected by noise, the presently filed embodiment is configured to execute filter treatment on these components $K(k)T_2(k)$ and $T_1(k)$ by using a lowpass filter operator given as $$G(s) = \frac{1}{\tau s + 1}. \quad (39)$$

Then, Eq. (30) is corrected in step S100 like $$\Delta I(k) = (V_{max} - V_0(k))G(s)\left\{\frac{T_1(k)}{K(k)T_2(k)}\right\}. \quad (40)$$

Using the current variation ΔI calculated in such a manner allows the value $P_{in}(k)$ in the k-th time's iteration for the available input power $P_{in}$ to be calculated as $$P_{in}(k) = V_{max}\Delta I(k) \quad (41)$$
$$= (V_{max} - V_0(k))G(s)\left\{\frac{T_1(k)}{K(k)T_2(k)}\right\}V_{max}.$$

As for the value $P_{out}(k)$ of the available output power $P_{out}$, Eq. (33) is similarly corrected as $$\Delta I(k) = (V_0(k) - V_{min})G(s)\left\{\frac{T_1(k)}{K(k)T_2(k)}\right\}. \quad (42)$$

By using the current variation ΔI calculated in such a way, the value $P_{out}(k)$ of the available output power $P_{out}$ in the k-th time's iteration is calculated as $$P_{out}(k) = V_{min}\Delta I(k) \quad (43)$$
$$= (V_0(k) - V_{min})G(s)\left\{\frac{T_1(k)}{K(k)T_2(k)}\right\}V_{min}.$$

Thus, in consideration of the fact that the components $K(k)T_2(k)$ and $T_1(k)$, which are associated with the direct term, in the value $\vec{\theta}(k)$ of the parameter vector $\vec{\theta}$ are easily affected by noise, the second embodiment executes the lowpass filter treatment on these components $K(k)T_2(k)$ and $T_1(k)$ (or components ($\hat{a}_n, \hat{b}_n$)) in the battery model shown in FIG. 7). Therefore, there is an advantage in that errors of the estimate value $\hat{P}_{in}$ of the available input power $P_{in}$ and the estimate value $\hat{P}_{out}$ of the available output power $P_{out}$ are further reduced because noise is less than that occurring when using the components $K(k)T_2(k)$, $T_1(k)$ (or ($\hat{a}_n, \hat{b}_n$)) in the battery model shown in FIG. 7) of the value $\vec{\theta}(k)$ of the parameter vector $\vec{\theta}$ calculated in the first embodiment.

Third Embodiment

A third embodiment is configured such that the lowpass filter treatment is executed on a ratio $$\frac{T_1(k)}{T_2(k)}$$

of the components $K(k)T_2(k)$ and $T_1(k)$ of the value $\vec{\theta}(k)$ of the parameter vector $\vec{\theta}$ (or ($\hat{a}_n, \hat{b}_n$)) in the battery model shown in FIG. 7), which are associated with the direct term obtained in the first embodiment.

The third embodiment differs from the first embodiment in respect of step S100 in the flowchart of the operations in the first embodiment, shown in FIG. 5, and is similar thereto in other respect. Therefore, description of the other respect is herein omitted.

Although the components $K(k)T_2(k)$ and $T_1(k)$ in the value $\hat{\theta}(k)$ of the parameter vector $\vec{\theta}$ calculated in step SS60 are easily affected by noise, variation of the value K(k) of internal resistance K, a steady state gain, is small. Therefore, in the presently filed embodiment, the filter treatment is executed on the ratio $$\frac{T_1(k)}{T_2(k)}$$

by using the lowpass filter operator G(s) represented by Eq. (39).

Then, Eq. (30) is corrected in step S100 like $$\Delta I(k) = \frac{(V_{max} - V_0(k))}{K(k)}G(s)\left\{\frac{T_1(k)}{T_2(k)}\right\}. \quad (44)$$

Using the current variation ΔI calculated in such a way, the value $P_{in}(k)$ of the available input power $P_{in}$ is calculated as $$P_{in}(k) = V_{max}\Delta I(k) \quad (45)$$
$$= \frac{(V_{max} - V_0(k))V_{max}}{K(k)}G(s)\left\{\frac{T_1(k)}{T_2(k)}\right\}.$$

For the value $P_{out}(k)$ of the available output power $P_{out}$ in the k-th time's iteration is similarly corrected like $$\Delta I(k) = \frac{(V_0(k) - V_{min})}{K(k)} G(s)\left\{\frac{T_1(k)}{T_2(k)}\right\}. \tag{46}$$

By using the current variation $\Delta I$ calculated in such a way, the value $P_{out}(k)$ of the available output power $P_{out}$ is calculated as $$P_{out}(k) = V_{max}\Delta I(k) \tag{47}$$
$$= \frac{(V_0(k) - V_{min})V_{min}}{K(k)} G(s)\left\{\frac{T_1(k)}{T_2(k)}\right\}.$$

Thus, in consideration of the fact that the components $K(k)T_2(k)$ and $T_1(k)$, which are associated with the direct term, of the value $\vec{\theta}(k)$ of the parameter vector $\vec{\theta}$ are easily affected by noise while variation of the value $K(k)$ of internal resistance K is small, the second embodiment executes the lowpass filter treatment on the ratio $$\frac{T_1(k)}{T_2(k)}.$$

By using the ratio $$\frac{T_1(k)}{T_2(k)}$$

filtered by the lowpass filter $G(s)$ in combination with the value $K(k)$ of the internal resistance K with less variation, there is advantage in that errors of the estimate value $\hat{P}_{in}$ of the available input power $P_{in}$ and the estimate value $\hat{P}_{out}$ of the available output power $P_{out}$ are further reduced because noise is less than that using only the components $K(k)T_2(k)$ and $T_1(k)$ of the value $\vec{\theta}(k)$ of the parameter vector $\vec{\theta}$ in the second embodiment, resulting from fluctuation in these components, is further eliminated.

As will be easily understood from the foregoing description, the present invention allows the estimation of available input power $P_{in}$ and available output power $P_{out}$ by using the estimate values $(\hat{a}_n, \hat{b}_n)$ of the parameter vector associated with the direct term whereby even in cases where the charging time interval is short like the pulsed charging, it becomes possible to calculate the current value $\Delta I$ by which the terminal voltage V reaches at the upper limit voltage $V_{max}$ of the terminal voltage V in the leading edge of the terminal voltage V. Accordingly, the estimate value $\hat{P}_{in}$ of the available input power $P_{in}$ can be precisely aligned with the actual value, enabling reduction in error. Similar advantageous effect also results in the estimate value $\hat{P}_{out}$ of the available output power $P_{out}$ under a situation where rapid charging takes place.

The entire content of Japanese Patent Application No. P2004-173448 with a filing data of Jun. 11, 2004 is herein incorporated by reference.

Although the present invention has been described above by reference to certain embodiments of the invention, the invention is not limited to the embodiments described above and modifications will occur to those skilled in the art, in light of the teachings. The scope of the invention is defined with reference to the following claims.

What is claimed is:

1. An available input-output power estimating device for a secondary battery, comprising:
   a current detector measuring a value I of a current of the secondary battery;
   a voltage detector measuring a value V of a terminal voltage of the secondary battery;
   a parameter estimating section substituting the measured current value I and the measured voltage value V into an adaptive digital filter using a battery model represented by an equation (a) for thereby collectively estimating a value of a parameter vector, as a parameter vector estimate value, in the equation (a);
   an open circuit voltage calculator substituting the measured current value I, the measured voltage value V, and the parameter estimate value into the equation (a) for thereby calculating a value $\hat{V}_0$, as an open circuit voltage estimate value, of an open circuit voltage $V_0$;
   an available input power estimating section substituting a set of components $(\hat{a}_n, \hat{b}_n)$, which is associated with a direct term in the equation (a) through an equation (d) where components $(\hat{a}_n, \hat{b}_n)$, are estimate values of parameters $(\hat{a}_n, \hat{b}_n)$, of the parameter vector estimate value, the open circuit voltage estimate value $\hat{V}_0$, and an upper limit voltage $V_{max}$, which is predetermined, of the terminal voltage V into an equation (b) for thereby estimating an available input power $P_{in}$ of the secondary battery; and
   an available output power estimating section substituting the one set of components $(\hat{a}_n, \hat{b}_n)$, which is associated with the direct term in the equation (a), of the parameter vector estimate value, the open circuit voltage estimate value $\hat{V}_0$, and a lower limit voltage $V_{min}$, which is predetermined, of the terminal voltage V into an equation (c) for thereby estimating an available output power $P_{out}$ of the secondary battery; wherein the equations (a), (b), and (c) are described, respectively, as $$V = \frac{B(s)}{A(s)}I + \frac{1}{C(s)}V_0, \tag{a}$$

$$\hat{P}_{in} = \frac{V_{max} - \hat{V}_0}{\hat{b}_n}\hat{a}_n V_{max}, \tag{b}$$

and $$\hat{P}_{out} = \frac{\hat{V}_0 - V_{min}}{\hat{b}_n}\hat{a}_n V_{min} \tag{c}$$

where $A(s)$, $B(s)$, and $C(s)$ represent polynomials of a Laplace operator s, respectively, as follows:

$$A(s) = \sum_{k=0}^{n} a_k s^k, \; B(s) = \sum_{k=0}^{n} b_k s^k, \text{ and } C(s) = \sum_{k=0}^{n} c_k s^k \tag{d}$$

where the first order coefficients $a_1$, $b_1$, and $c_1$ of the polynomials take non-zero values, respectively, wherein:
   the set of components $(\hat{a}_n, \hat{b}_n)$ includes time constants of the parameter vector estimate value and is filtered with a lowpass function.

2. The available input-output power estimating device for the secondary battery according to claim 1, wherein:
in case of A(s)=[[K (T$_2$s+1)]]T$_1$s+1, B(s)=[[T$_1$s+1]]K(T$_2$s+1), and C(s)=T$_3$s+1 in the equation (a), components $\hat{T}_1$ and $\hat{K}\hat{T}_2$ of the parameter vector estimate value are filtered with a lowpass transfer function G(s) and then, in place of the equation (b) and the equation (c), an equation (e) and an equation (f) are used, wherein the equations (e) and (f) are described, respectively, as $$\hat{P}_{in} = (V_{max} - \hat{V}_0)G(s)\left\{\frac{\hat{T}_1}{\hat{K}\hat{T}_2}\right\}V_{max}, \quad (e)$$

and $$\hat{P}_{out} = (\hat{V}_0 - V_{min})G(s)\left\{\frac{\hat{T}_1}{\hat{K}\hat{T}_2}\right\}V_{min} \quad (f)$$

where T$_1$, T$_2$, and T$_3$ are time constants, respectively; K is an internal resistance of the secondary battery.

3. The available input-output power estimating device for the secondary battery according to claim 1, wherein:
in case of A(s)=[[K(T$_2$s+1)]]T$_1$s1, B(s)=K(T$_2$s+1), and C(s)=T$_3$s +1 in the equation (d), a filter treatment is executed on a ratio $$\frac{\hat{T}_1}{\hat{T}_2}$$

calculated from the parameter vector estimate value being filtered with a lowpass transfer function G(s) and then, in place of the equation (b) and the equation (c), an equation (g) and an equation (h) are used, wherein the equations (g) and (h) are described as $$\hat{P}_{in} = \frac{V_{max} - \hat{V}_0}{\hat{K}}G(s)\left\{\frac{\hat{T}_1}{\hat{T}_2}\right\}V_{max}, \quad (g)$$

and $$\hat{P}_{out} = \frac{\hat{V}_0 - V_{min}}{\hat{K}}G(s)\left\{\frac{\hat{T}_1}{\hat{T}_2}\right\} \cdot V_{min}, \quad (h)$$

where T$_1$, T$_2$, and T$_3$ are time constants, respectively; K is an internal resistance of the secondary battery.

4. An available input-output power estimating device for a secondary battery, comprising:
a current detecting means measuring a value I of a current of the secondary battery;
a voltage detecting means measuring a value V of a terminal voltage of the secondary battery;
a parameter estimating means substituting the measured current value I and the measured voltage value V into an adaptive digital filter using a battery model represented by an equation (a) for thereby collectively estimating a value of a parameter vector, as a parameter vector estimate value, in the equation (a);
an open circuit voltage calculating means substituting the measured current value I, the measured voltage value V, and the parameter estimate value into the equation (a) for thereby calculating a value $\hat{V}_0$, as an open circuit voltage estimate value, of an open circuit voltage V$_0$;
an available input power estimating means substituting a set of components ($\hat{a}_n,\hat{b}_n$), which is associated with a direct term in the equation (a) through equation (d) where components ($\hat{a}_n,\hat{b}_n$) are estimate values of parameters ($\hat{a}_n,\hat{b}_n$), of the parameter vector estimate value, the open circuit voltage estimate value $\hat{V}_0$, and an upper limit voltage V$_{max}$, which is predetermined, of the terminal voltage V into an equation (b) for thereby estimating an available input power P$_{in}$ of the secondary battery; and
an available output power estimating means substituting the one set of components ($\hat{a}_n,\hat{b}_n$), which is associated with the direct term in the equation (a), of the parameter vector estimate value, the open circuit voltage estimate value $\hat{V}_0$, and a lower limit voltage V$_{min}$, which is predetermined, of the terminal voltage V into an equation (c) for thereby estimating an available output power P$_{out}$ of the secondary battery; wherein
the equations (a), (b), and (c) are described, respectively, as $$V = \frac{B(s)}{A(s)}I + \frac{1}{C(s)}V_0, \quad (a)$$

$$\hat{P}_{in} = \frac{V_{max} - \hat{V}_0}{\hat{b}_n}\hat{a}_n V_{max}, \quad (b)$$

and $$\hat{P}_{out} = \frac{\hat{V}_0 - V_{min}}{\hat{b}_n}\hat{a}_n V_{min} \quad (c)$$

where A(s), B(s), and C(s) represent polynomials of a Laplace operator s, respectively, as follows:

$$A(s) = \sum_{k=0}^{n} a_k s^k, B(s) = \sum_{k=0}^{n} b_k s^k, \text{ and } C(s) = \sum_{k=0}^{n} c_k s^k \quad (d)$$

where the first order coefficients a$_1$, b$_1$, and c$_1$ of the polynomials take non-zero values, respectively, wherein:
the set of components ($\hat{a}_n,\hat{b}_n$) includes time constants of the parameter vector estimate value and is filtered with a lowpass function.

5. An estimating method of an available input-output power for a secondary battery, comprising:
measuring a value I of a current of the secondary battery;
measuring a value V of a terminal voltage of the secondary battery;
substituting the measured current value I and the measured voltage value V into an adaptive digital filter using a battery model represented by an equation (a) for thereby collectively estimating a value of a parameter vector, as a parameter vector estimate value, in the equation (a);
substituting the measured current value I, the measured voltage value V, and the parameter estimate value into the equation (a) for thereby calculating a value $\hat{V}_0$, as an open circuit voltage estimate value, of an open circuit voltage V$_0$;
substituting a set of components ($\hat{a}_n,\hat{b}_n$), which is associated with a direct term in the equation (a) through equation (d) where components ($\hat{a}_n,\hat{b}_n$) are estimate values of parameters ($\hat{a}_n,\hat{b}_n$), of the parameter vector estimate value, the open circuit voltage estimate value $\hat{V}_0$, and an upper limit voltage V$_{max}$, which is predetermined, of the terminal voltage V into an equation (b) for thereby estimating an available input power $P_{in}$ of the secondary battery; and substituting the one set of components $(\hat{a}_n, \hat{b}_n)$, which is associated with the direct term in the equation (a), of the parameter vector estimate value, the open circuit voltage estimate value $\hat{V}_0$, and a lower limit voltage $V_{min}$, which is predetermined, of the terminal voltage V into an equation (c) for thereby estimating an available output power $P_{out}$ of the secondary battery; wherein the equations (a), (b), and (c) are described, respectively, as $$V = \frac{B(s)}{A(s)} I + \frac{1}{C(s)} V_0, \tag{a}$$

$$\hat{P}_{in} = \frac{V_{max} - \hat{V}_0}{\hat{b}_n} \hat{a}_n V_{max}, \tag{b}$$

and $$\hat{P}_{out} = \frac{\hat{V}_0 - V_{min}}{\hat{b}_n} \hat{a}_n V_{min} \tag{c}$$

where A(s), B(s), and C(s) represent polynomials of a Laplace operator s, respectively, as follows:

$$A(s) = \sum_{k=0}^{n} a_k s^k, \ B(s) = \sum_{k=0}^{n} b_k s^k, \text{ and } C(s) = \sum_{k=0}^{n} c_k s^k \tag{d}$$

where the first order coefficients $a_1$, $b_1$, and $c_1$ of the polynomials take non-zero values, respectively, wherein:

the set of components $(\hat{a}_n, \hat{b}_n)$ includes time constants of the parameter vector estimate value and is filtered with a lowpass function.

* * * * *